United States Patent
Park et al.

(10) Patent No.: US 11,901,269 B2
(45) Date of Patent: Feb. 13, 2024

(54) SEMICONDUCTOR PACKAGE

(71) Applicant: SAMSUNG ELECTRONICS CO., LTD., Suwon-si (KR)

(72) Inventors: Seongchan Park, Suwon-si (KR); Sanghyun Kwon, Suwon-si (KR); Hyungkyu Kim, Suwon-si (KR); Han Kim, Suwon-si (KR); Choonkeun Lee, Suwon-si (KR); Seungon Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/687,072

(22) Filed: Mar. 4, 2022

(65) Prior Publication Data

US 2022/0189860 A1 Jun. 16, 2022

Related U.S. Application Data

(63) Continuation of application No. 16/593,300, filed on Oct. 4, 2019, now abandoned.

(30) Foreign Application Priority Data

Dec. 26, 2018 (KR) .......................... 10-2018-0169578

(51) Int. Cl.
*H01L 23/48* (2006.01)
*H01L 23/495* (2006.01)
(Continued)

(52) U.S. Cl.
CPC .... *H01L 23/49568* (2013.01); *H01L 23/3178* (2013.01); *H01L 23/367* (2013.01);
(Continued)

(58) Field of Classification Search
CPC ....... H01L 2224/16145; H01L 2224/16; H01L 24/32; H01L 24/20; H01L 23/3121; H01L 23/3128; H01L 23/16; H01L 23/36
See application file for complete search history.

(56) References Cited

U.S. PATENT DOCUMENTS 10,026,681 B2 * 7/2018 Ko ........................ H01L 23/562
2007/0281393 A1 12/2007 Gautham et al.
(Continued)

FOREIGN PATENT DOCUMENTS

JP 2014-216443 A 11/2014
JP 5707810 B2 4/2015
(Continued)

OTHER PUBLICATIONS

Office Action dated Mar. 15, 2023, issued by Korean Intellectual Property Office for Korean Application No. 10-2018-0169578.
(Continued)

*Primary Examiner* — Hoa B Trinh
(74) *Attorney, Agent, or Firm* — Sughrue Mion, PLLC

(57) ABSTRACT

A semiconductor package includes: a semiconductor chip having an active surface, on which a connection pad is disposed, and an inactive surface opposite to the active surface; a heat-dissipating member disposed on the inactive surface of the semiconductor chip and including graphite; an encapsulant sealing at least a portion of each of the semiconductor chip and the heat-dissipating member; a capping metal layer disposed directly between the heat-dissipating member and the encapsulant; and a connection structure disposed on the active surface of the semiconductor chip and including a redistribution layer electrically connected to the connection pad, wherein the heat-dissipating member includes holes passing through at least a portion of the heat-dissipating member, and the holes overlap the inactive surface of the semiconductor chip.

20 Claims, 16 Drawing Sheets

(51) Int. Cl.
*H01L 23/433* (2006.01)
*H01L 23/31* (2006.01)
*H01L 23/498* (2006.01)
*H01L 23/373* (2006.01)
*H01L 23/367* (2006.01)

(52) U.S. Cl.
CPC ...... *H01L 23/3735* (2013.01); *H01L 23/4334* (2013.01); *H01L 23/49805* (2013.01); *H01L 23/49827* (2013.01); *H01L 2224/02371* (2013.01)

(56) References Cited

U.S. PATENT DOCUMENTS

| | | |
|---|---|---|
| 2013/0313697 A1 | 11/2013 | Sato |
| 2014/0077394 A1 | 3/2014 | Chang et al. |
| 2015/0262904 A1 | 9/2015 | Hung et al. |
| 2015/0348865 A1 | 12/2015 | Vincent et al. |
| 2017/0176117 A1 | 6/2017 | Wu et al. |
| 2017/0207205 A1 | 7/2017 | Kim et al. |
| 2017/0309571 A1 | 10/2017 | Yi et al. |
| 2018/0053719 A1 | 2/2018 | Kim et al. |
| 2018/0096927 A1 | 4/2018 | Kim et al. |
| 2018/0269127 A1 | 9/2018 | Hung et al. |
| 2019/0189599 A1 | 6/2019 | Baloglu et al. |

FOREIGN PATENT DOCUMENTS

| | | |
|---|---|---|
| KR | 10-2017-0085932 A | 7/2017 |
| KR | 10-2018-0020860 A | 2/2018 |
| TW | 201724403 A | 7/2017 |

OTHER PUBLICATIONS

Communication dated Aug. 26, 2023 issued by the Chinese Patent Office in counterpart Chinese Application No. 201911346125.9.

\* cited by examiner

I-I'

II-II'

SEMICONDUCTOR PACKAGE

CROSS-REFERENCE TO RELATED APPLICATIONS

This application is a continuation of U.S. application Ser. No. 16/593,300, filed Oct. 4, 2019, which claims benefit of priority to Korean Patent Application No. 10-2018-0169578 filed on Dec. 26, 2018 in the Korean Intellectual Property Office, the disclosures of which are incorporated herein by reference in their entirety.

BACKGROUND

1. Field

The present disclosure relates to a semiconductor package.

2. Description of Related Art

Semiconductor packages are continuously pursuing lightness, thinness, shortness, and compactness in terms of design, while seeking to realize a System in Package (SiP) package requiring complexity and versatility in terms of functionality. One type of package technology suggested to satisfy the technical demand, described above, is a fan-out semiconductor package. Such a fan-out semiconductor package has a compact size and may allow a plurality of pins to be implemented by redistributing connection terminals outwardly of a region in which a semiconductor chip is disposed.

In detail, in a recently developed application processor (AP) package, a structure and a material, capable of significantly reducing a thickness of a package while improving heat dissipation characteristics for quickly emitting heat, generated during an operation, externally, are required.

SUMMARY

An aspect of the present disclosure is to provide a semiconductor package with excellent heat dissipation characteristics and having a heat-dissipating member with thermal expansion characteristics similar to those of a semiconductor chip.

According to an aspect of the present disclosure, in a semiconductor package, a heat-dissipating member including pyrolytic graphite is disposed on an inactive surface of a semiconductor chip, and an encapsulant is disposed to cover the semiconductor chip and the heat-dissipating member.

The semiconductor package according to an embodiment includes: a semiconductor chip having an active surface on which a connection pad is disposed and an inactive surface opposite to the active surface; a heat-dissipating member, which includes graphite, disposed on the inactive surface of the semiconductor chip; an encapsulant sealing at least a portion of each of the semiconductor chip and the heat-dissipating member; and a connection structure, which includes a redistribution layer electrically connected to the connection pad, disposed on the active surface of the semiconductor chip, wherein at least a side surface of the heat-dissipating member is coplanar with a side surface of the semiconductor chip.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
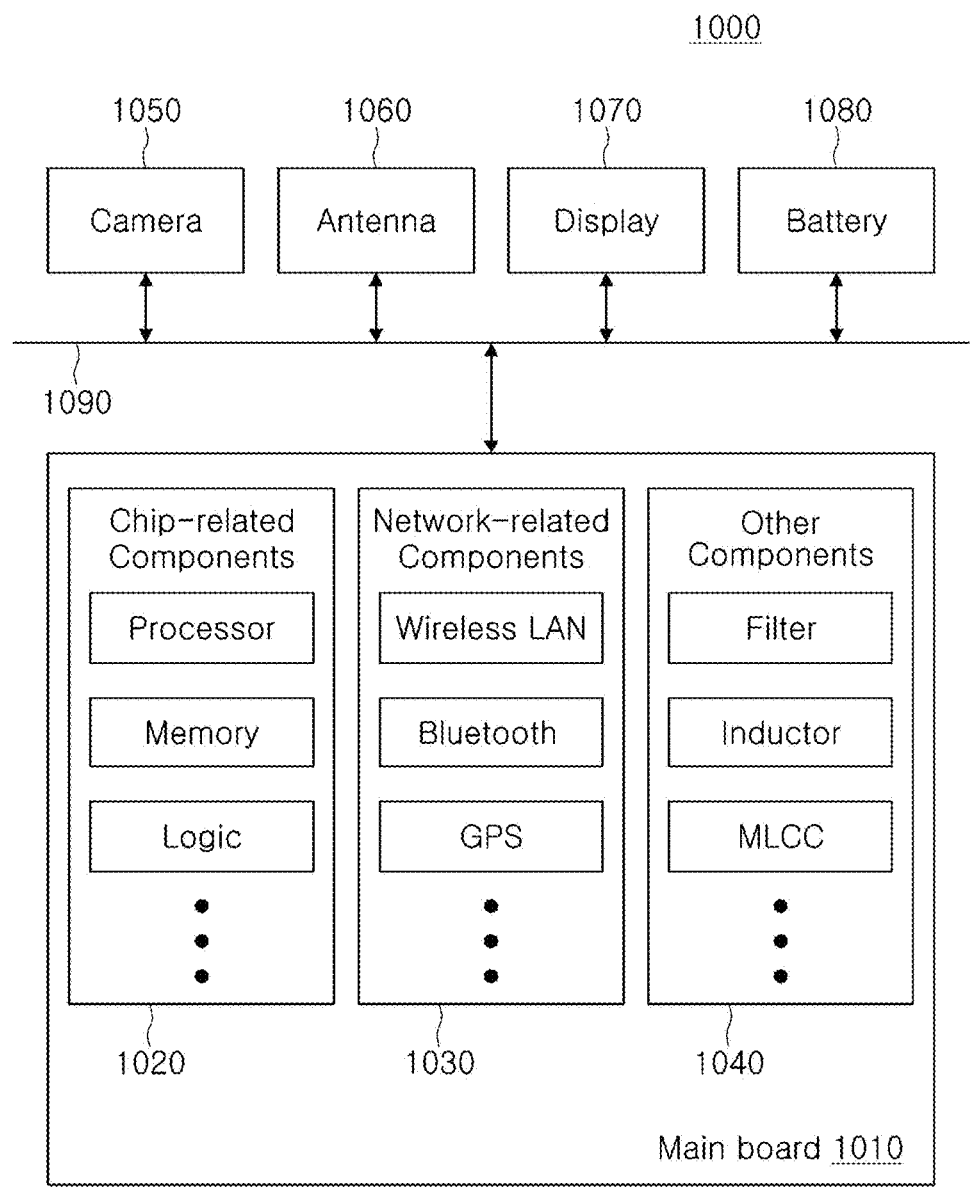
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a mainboard 1010 therein. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
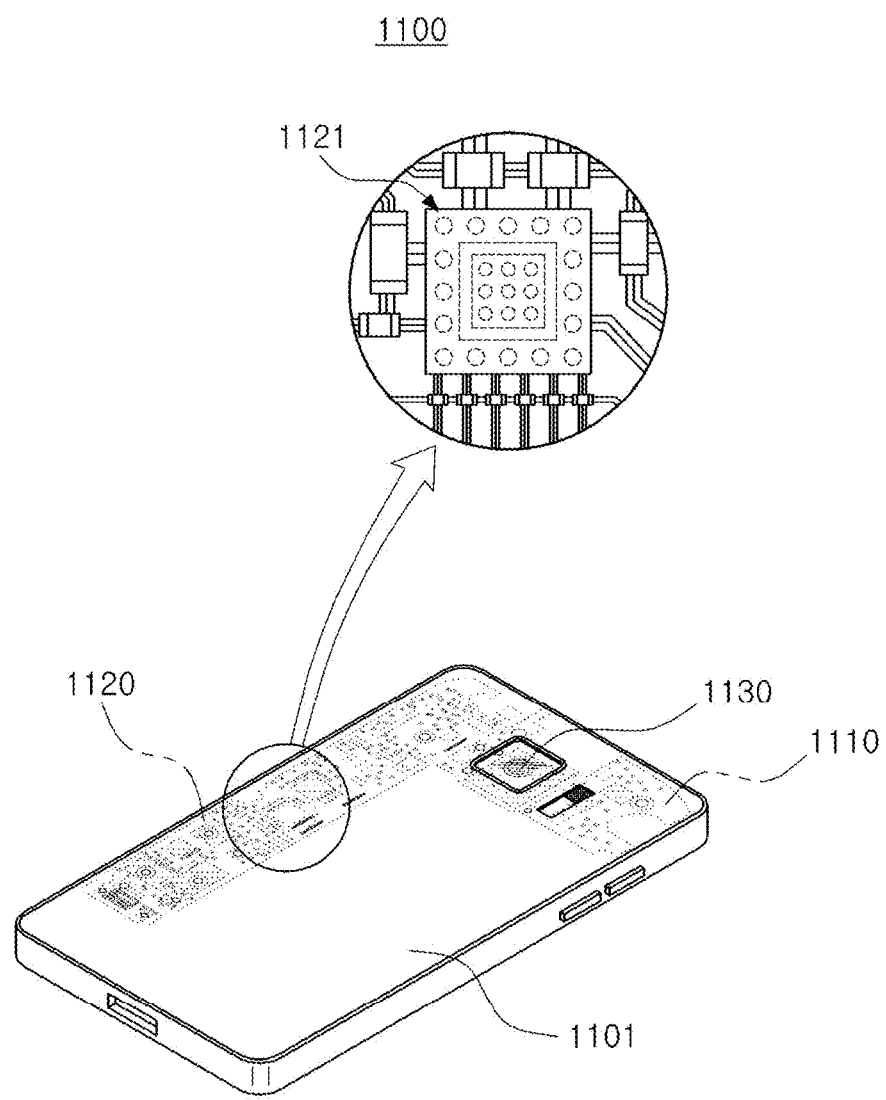
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
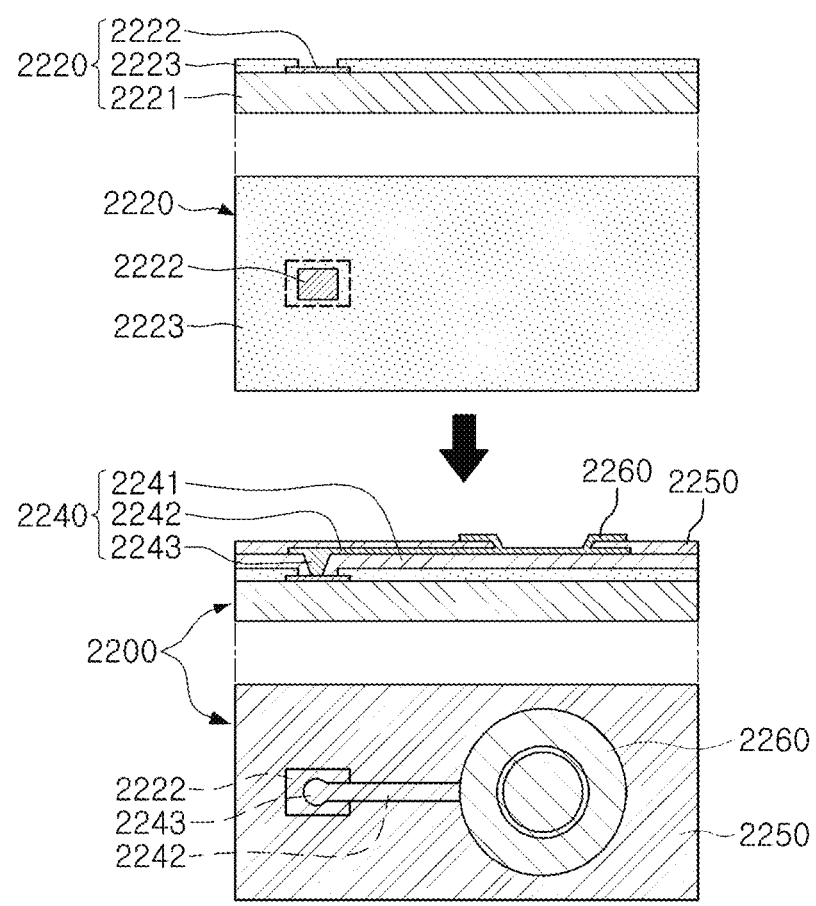
FIGS. 3A and 3B are schematic cross-sectional views illustrating states of a fan-in semiconductor package before and after being packaged.
Figure 3B:
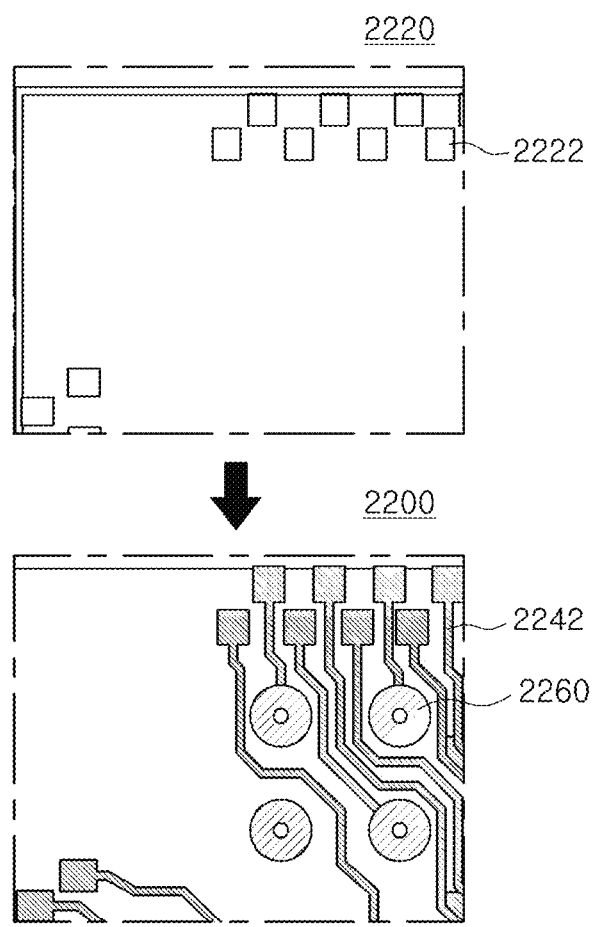

FIGS. 3A and 3B are schematic cross-sectional views illustrating states of a fan-in semiconductor package before and after being packaged.

Figure 4:
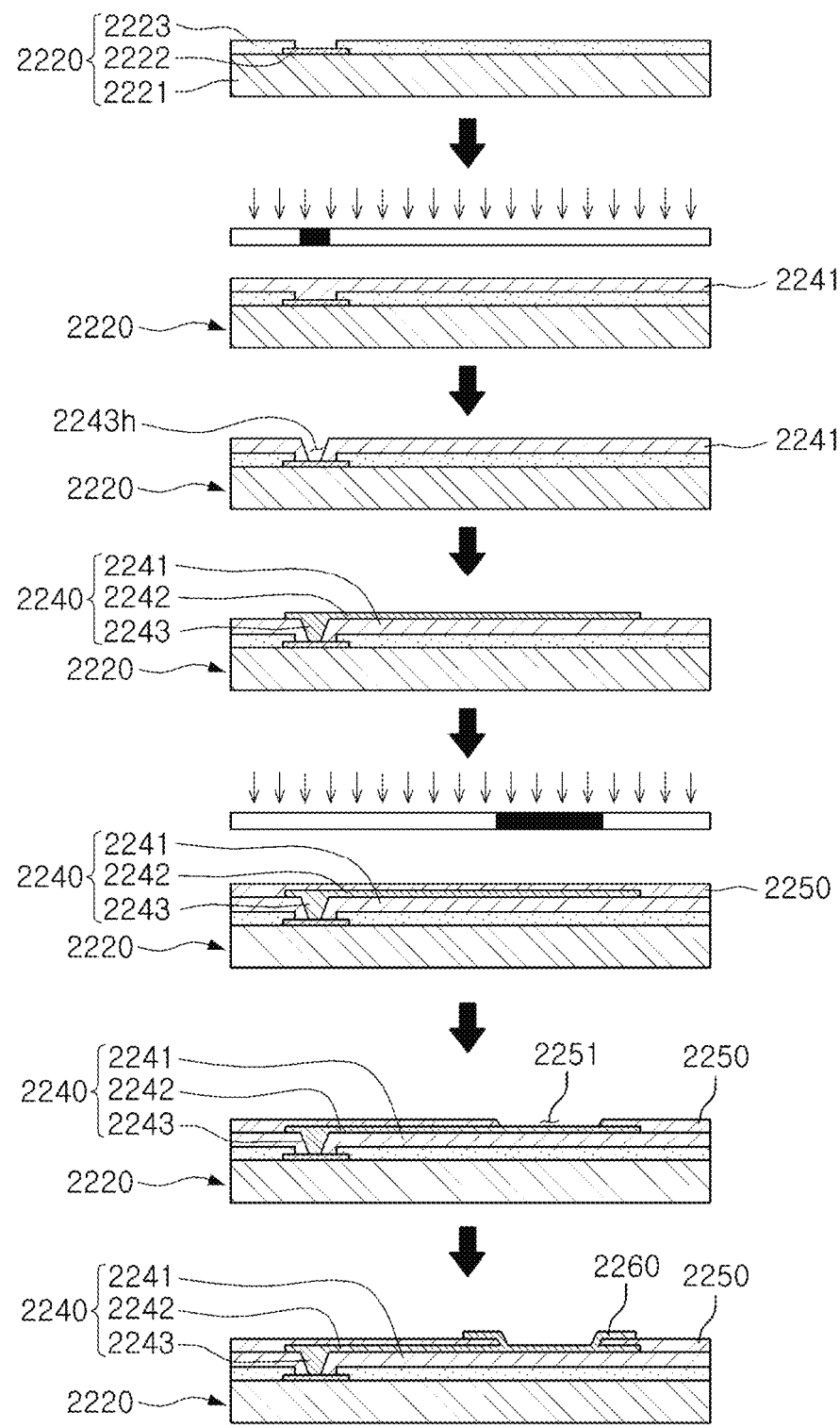
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
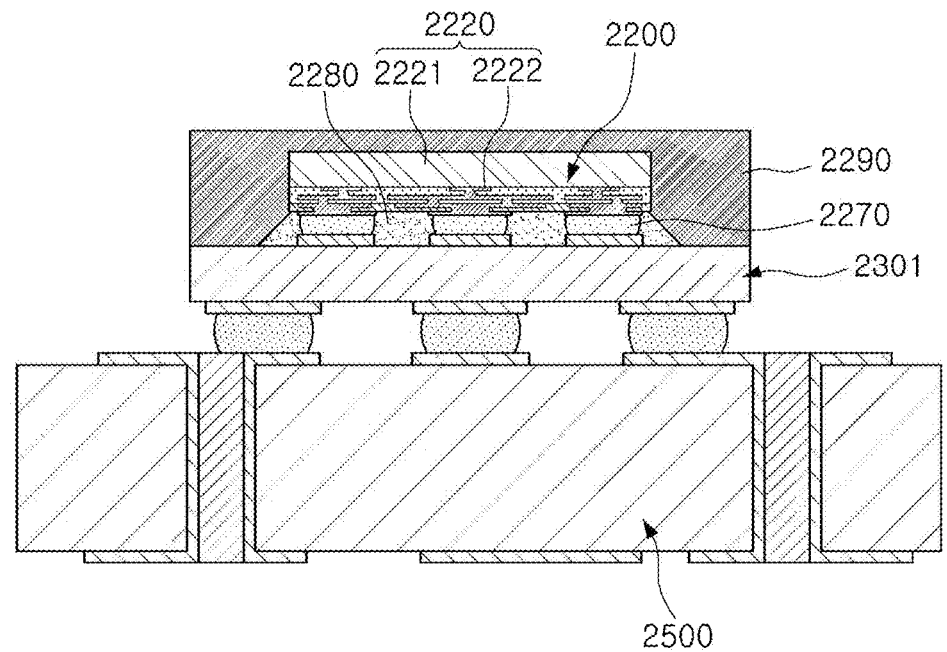
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
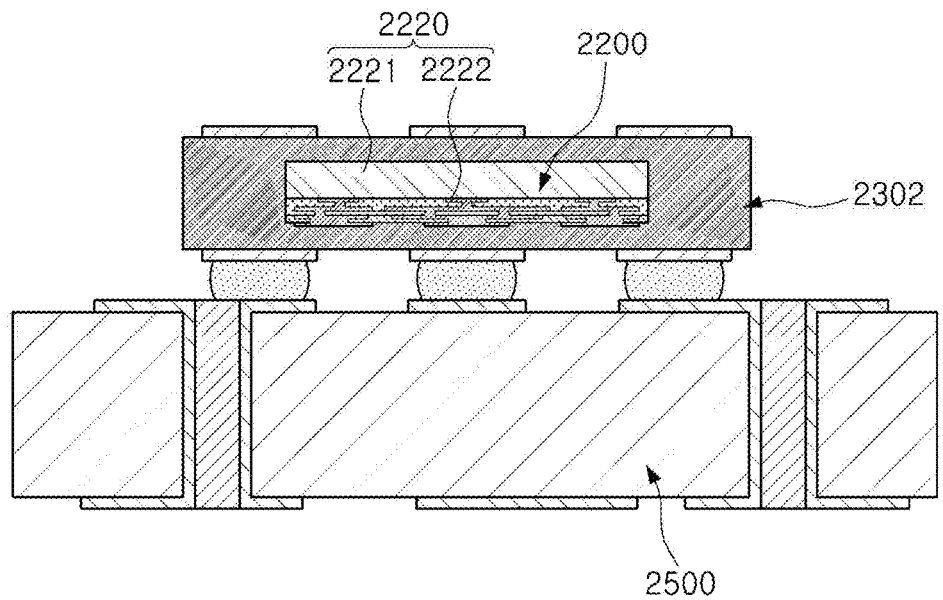
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard

2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
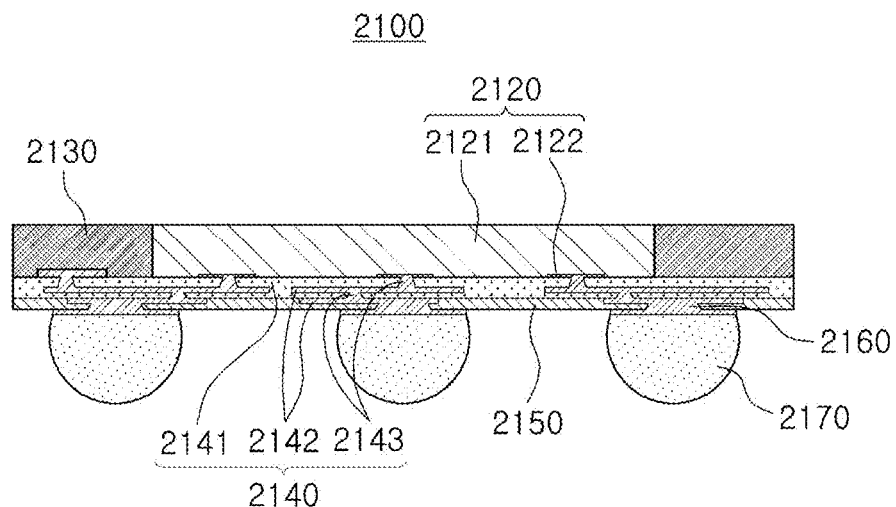
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
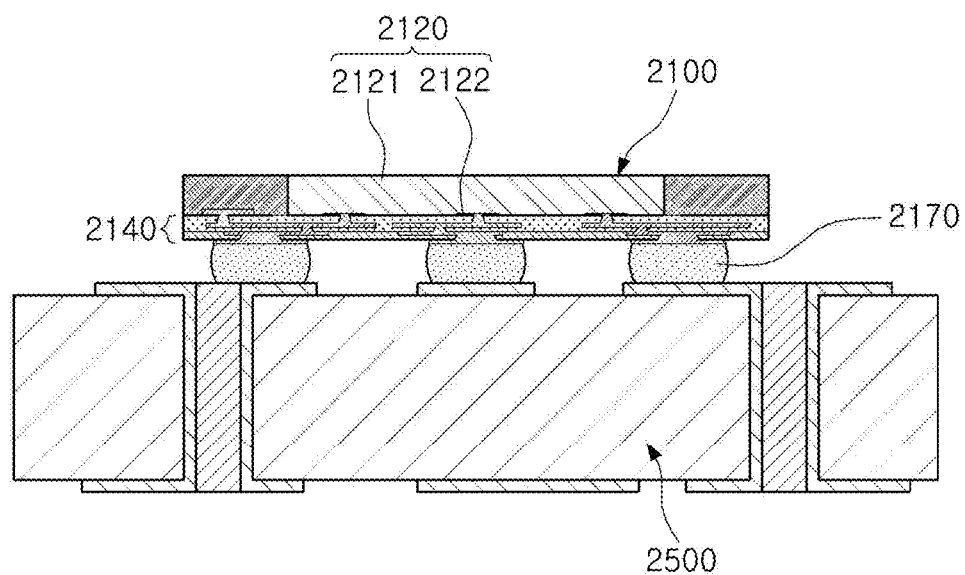
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
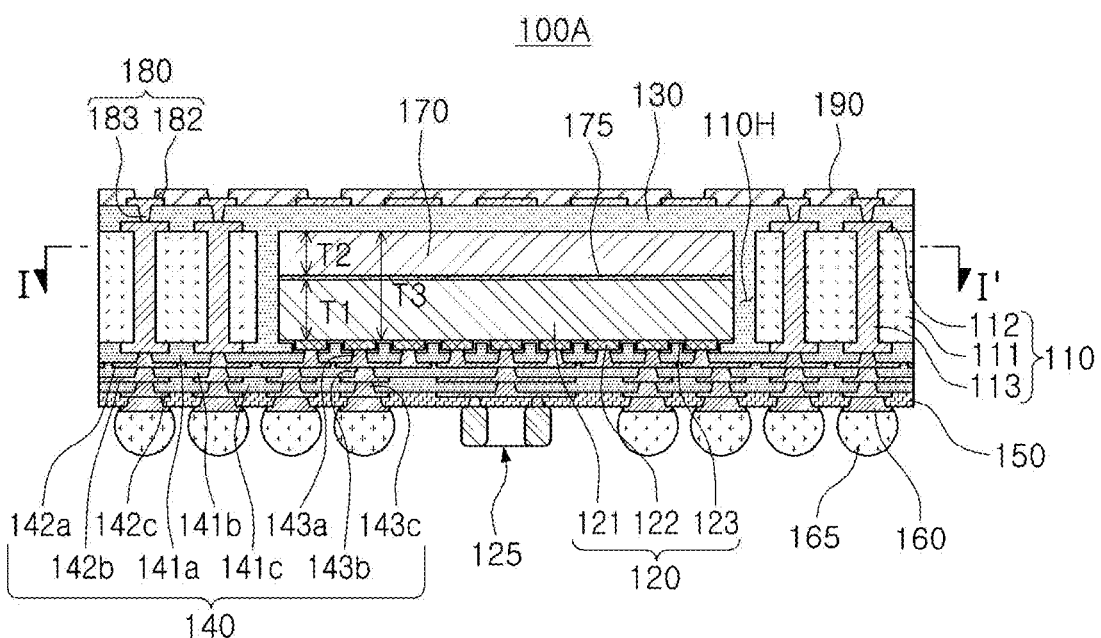
FIG. 9 is a schematic cross-sectional view illustrating an example of a semiconductor package.

FIG. 9 is a schematic cross-sectional view illustrating an example of a semiconductor package.

Figure 10:
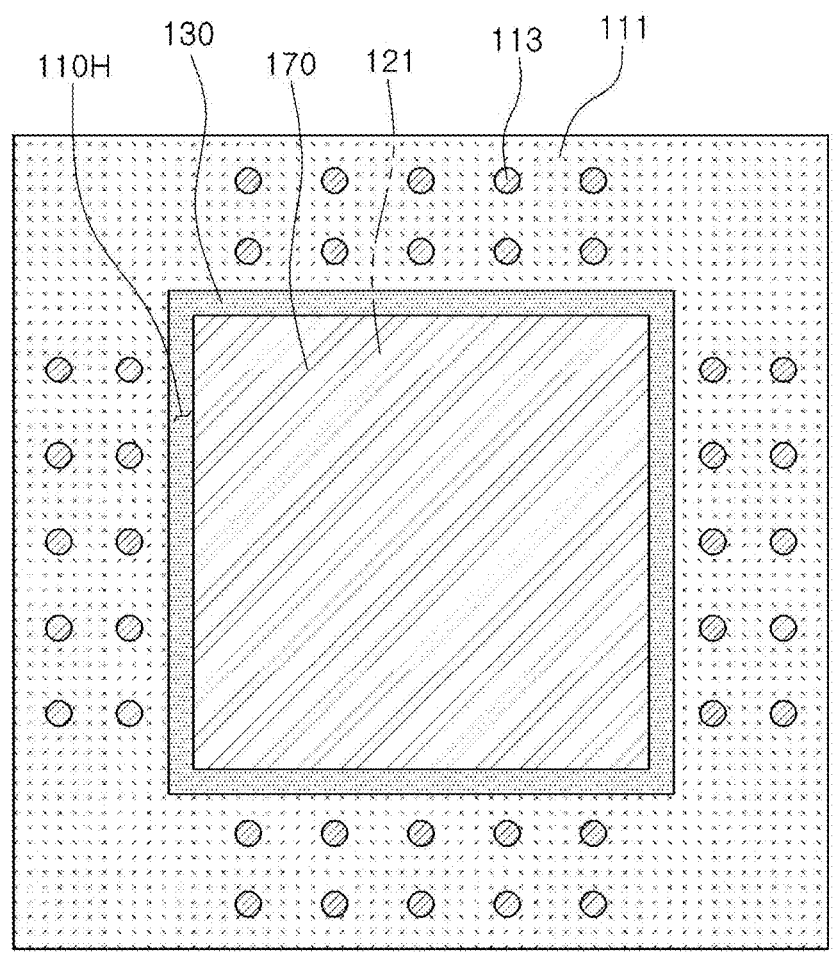
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100A according to an embodiment may include a frame 110 having a through-hole 110H, a semiconductor chip 120 disposed in the through-hole 110H of the frame 110, and having an active surface on which the connection pad 122 is disposed, and an inactive surface opposite to the active surface, a heat-dissipating member 170 disposed on the inactive surface of the semiconductor chip 120 and including pyrolytic graphite, an encapsulant 130 sealing at least portions of the frame 110, the semiconductor chip 120, and the heat-dissipating member 170, a first connection structure 140 disposed on the frame 110 and the active surface of the semiconductor chip 120, a second connection structure 180 disposed on the encapsulant 130 and including a backside redistribution layer 182, a first passivation layer 150 disposed on the first connection structure 140, an underbump metal layer 160 disposed in an opening of the first passivation layer 150, an electrical connection metal 165 disposed on the first passivation layer 150 and connected to the underbump metal layer 160, a second passivation layer 190 disposed on the second connection structure 180, and a passive component disposed on the first passivation layer 150.

Meanwhile, in the case of a System on Chip (SoC) such as an application processor (AP), heat is generated locally in a position in which computation inside a semiconductor chip is performed. In this regard, a heat dissipation member disposed near such a heat generation position may be effective for heat dissipation. In the case of the semiconductor package 100A according to an embodiment, the heat-dissipating member 170 including pyrolytic graphite is disposed on the semiconductor chip 120 such as an AP chip, thereby securing heat dissipation characteristics. The heat-dissipating member 170 may include pyrolytic graphite having an excellent heat dissipation effect. The pyrolytic graphite may be produced to have a sheet form after a raw material such as polyimid is carbonized and graphitized by pyrolysis at high temperature. In detail, the pyrolytic graphite may have high thermal conductivity in a plane direction (an x-y direction), a direction in which an upper surface of the semiconductor chip 120 is extended. In this specification, the 'pyrolytic graphite' may include a material such as thermal pyrolytic graphite, (TPG), highly oriented pyrolytic graphite (HOPG), compression annealed thermal pyrolytic graphite (CAPG), or the like. In detail, the heat-dissipating member 170 may include 90 wt % or more of the pyrolytic graphite. In addition, the heat-dissipating member 170 may include an additive to reduce thermal contact resistance, for example, a carbide forming additive, such as zirconium (Zr), chromium (Cr), boron (B), or the like, in an amount less than 5 wt %, and may include an additive to increase thermal conductivity in a vertical direction (a z direction), for example, a carbon nanotube (CNT), a boron nitride, and combinations thereof, in an amount less than 5 wt %.

The heat-dissipating member 170 may have a second thickness T2, less than a first thickness T1 of the semiconductor chip 120. For example, the thickness T2 of the heat-dissipating member 170 may be less than 50% of a total thickness T3 of the semiconductor chip 120 and the heat-dissipating member 170, but is not limited thereto. For example, the thickness T1 of the semiconductor chip 120 has a range of 50 μm to 180 μm, and the thickness T2 of the heat-dissipating member 170 may have a range of 20 μm or more, for example, a range of 20 μm to 100 μm. In one embodiment, the thickness T2 of the heat-dissipating member 170 may have, for example, 30 μm, 40 μm, 50 μm, 60 μm, 70 μm, or 80 μm. The heat-dissipating member 170 includes pyrolytic graphite, among carbon-based materials, and may thus be manufactured to have a thickness in the range described above. For example, among other carbon-based materials, in the case of graphene, a thickness may be significantly small to apply. Moreover, in the case of silicon carbide (SiC), it may be difficult to perform a thinning process. On the other hand, the pyrolytic graphite may have the advantages of easily controlling a thickness and easily performing a process.

The heat-dissipating member 170 may have thermal conductivity, higher than about 150 W/mK, which is thermal conductivity of silicon. In detail, the heat-dissipating member 170 may have thermal conductivity of about 500 W/mK or more in a horizontal direction, for example, thermal conductivity in a range of 1000 W/mK to 2000 W/mK. Moreover, a coefficient of thermal expansion (CTE) of silicon (Si) is about 2.7 ppm/K, and a difference in coefficients of thermal expansion between the heat-dissipating member 170 and silicon (Si) may be equal to or less than 10 ppm/K. In detail, the heat-dissipating member 170 may have a coefficient of thermal expansion (CTE) in a range of about 1 ppm/K to 8 ppm/K. As described above, the heat-dissipating member 170 has high thermal conductivity, while a difference in coefficients of thermal expansion with the semiconductor chip 120, mainly formed of silicon, is significantly reduced. Thus, occurrence of warpage, interface peeling, and the like, may be prevented.

The respective components included in the fan-out semiconductor package 100A according to the exemplary embodiment will hereinafter be described in more detail.

The frame 110 may improve rigidity of the semiconductor package 100A depending on certain materials, and serve to secure uniformity of a thickness of the encapsulant 130. Moreover, due to the frame 110, the semiconductor package 100A according to an embodiment may be used as a portion of a Package on Package (POP) structure. The frame 110 may have a through-hole 110H. The semiconductor chip 120 and the heat-dissipating member 170 may be disposed in the through-hole 110H to be spaced apart from the frame 110 by a predetermined distance. Side surfaces of the semiconductor chip 120 may be surrounded by the frame 110. However, such a form is only an example and may be variously modified to have other forms, and another function may be performed depending on such a form. The frame 110 may be omitted if necessary, but the case having the frame 110 may be more advantageous in securing the board level reliability as intended in the present disclosure.

The frame 110 may improve rigidity of the semiconductor package 100A depending on certain materials, and serve to secure uniformity of a thickness of the encapsulant 130. The frame 110 may have a through-hole 110H, passing through at least the frame insulating layer 111. In the through-hole 110H, the semiconductor chip 120 is disposed, and a passive component may be disposed together as required. As illustrated in FIG. 10, the through-hole 110H may have a wall surface surrounding the semiconductor chip 120, but is not limited thereto. The frame 110 may further include a wiring layer 112 and a connection via 113, in addition to the frame insulating layer 111, to function as an electrical connecting member.

For example, an insulating material may be used as the material of the frame insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto build-up film (ABF), FR-4, a bismaleimide triazine (BT), or the like. Such a frame 110 may serve as a supporting member.

The wiring layers 112 may provide an upper/lower electrical connection path of a package with the connection via 113, and may serve to redistribute the connection pad 122. The wiring layer 112 may be disposed on an upper surface and a lower surface of the frame insulating layer 111. A material for formation of the wiring layer 112 may also be a metal material such as copper (Cu), aluminum (Al), silver (Ag), tin (Sn), gold (Au), nickel (Ni), lead (Pb), titanium (Ti), or alloys thereof. The wiring layer 112 may perform various functions depending on a design of a corresponding layer. For example, the wiring layers may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layer may include via pads, electrical connection metal pads, and the like. The wiring layers 112 may be formed using a known plating process, and each may be formed of a seed layer and a conductor layer.

The connection via 113 may pass through an upper surface and a lower surface of the frame insulating layer 111. The connection via 113 may electrically connect the wiring layers 112, formed on upper and lower surfaces of the frame insulating layer 111, to each other, resulting in an electrical path in the frame 110. A material for formation of the connection via 113 may also be a metal material such as copper (Cu), aluminum (Al), silver (Ag), tin (Sn), gold (Au), nickel (Ni), lead (Pb), titanium (Ti), or alloys thereof. The connection via 113 may be a via in a filled type, filled with a metal material, or may be a via in a conformal type, in which a metal material is formed along a wall surface of a via hole. Each of the connection vias 113 may have a cylindrical shape having a substantially constant width. Moreover, each of the connection vias may have a tapered shape. The connection via 113 may be formed using a plating process, and may be formed of a seed layer and a conductor layer.

The semiconductor chip 120 may be an integrated circuit (IC) provided in an amount of several hundred to several million or more elements integrated in a single chip. The IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like, but is not limited thereto Moreover, these chip related components are also combined.

In the semiconductor chip 120, a side, on which connection pad 122 is disposed, is an active surface, and the opposite side is an inactive surface. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer.

Meanwhile, although not illustrated in the drawings, a metal thin film may be formed on the wall surface of the through-hole 110H for the purpose of radiating heat and/or shielding electromagnetic waves, if necessary. Moreover, a plurality of semiconductor chips, performing functions that are the same as or different from each other, may be disposed in the through-hole 110H, if necessary. In addition, a separate passive component such as an inductor, a capacitor, or the like, may be disposed in the through-hole 110H, if necessary.

The heat-dissipating member 170 is disposed on the entirety of the inactive surface of the semiconductor chip 120, and may be disposed in the through-hole 110H of the frame 110 together with the semiconductor chip 120. The heat-dissipating member 170 may have substantially the same size as that of the semiconductor chip 120 on the plane. At least a side surface of the heat-dissipating member 170 may be substantially coplanar with a side surface of the semiconductor chip 120.

The heat-dissipating member 170 may be provided in the form of a sheet, and may be attached to the inactive surface of the semiconductor chip 120 by an adhesive layer 175. In this case, the adhesive layer 175 may include a thermosetting adhesive with low viscosity, may have a thickness of 2 μm or less, and may be produced by an application method or a method of an initiated chemical vapor deposition (iCVD) using an initiator. Alternatively, the adhesive layer 175 may include an adhesive with high thermal conductivity having a thickness of 2 μm or more. In this case, the thermal conductivity of the adhesive may be 0.5 W/mK or more, and the adhesive layer may include a resin and a high thermal conductivity metal dispersed in the resin, and/or ceramic fillers. However, according to an embodiment, the heat-dissipating member 170 may be directly bonded to the inactive surface of the semiconductor chip 120 without interposition of an adhesive layer. In this case, surfaces of the semiconductor chip 120 and the heat-dissipating member 170, to be bonded, are mechanically and chemically modified using a chemical mechanical polishing (CMP) process, or the like, and may be pressed and/or heated to be bonded.

The encapsulant 130 may fill at least a portion of the through-hole 110H, while sealing the semiconductor chip 120 and the heat-dissipating member 170. An encapsulation form of the encapsulant is not particularly limited, but may be a form in which the encapsulant surrounds each of the semiconductor chip 120 and the heat-dissipating member 170. In this case, the encapsulant 130 may cover four side surfaces of the semiconductor chip 120 and an upper surface and four side surfaces of the heat-dissipating member 170, and fill at least a portion of a space between a wall surface of the through-hole 110H, a side surface of the semiconductor chip 120, and a side surface of the heat-dissipating member 170. Meanwhile, the encapsulant 130 may fill the through-hole 110H to thus serve as an adhesive for fixing the semiconductor chip 120 and reduce buckling depending on certain materials. The encapsulant 130 may include an insulating material. The insulating material may be a material containing an inorganic filler and an insulating resin, for example, a thermosetting resin such as an epoxy resin, a thermoplastic resin such as a polyimid, or a resin in which a reinforcement such as an inorganic filler is contained in the thermosetting resin or the thermoplastic resin, in detail, ABF, an FR-4 resin, a BT resin, a resin, or the like. Moreover, a molding material such as an epoxy molding compound (EMC) may be used, or a photosensitive material, that is, a photo imageable encapsulant (PIE) may be used, as needed.

As needed, a material in which an insulating resin such as the thermosetting resin or the thermoplastic resin is impregnated in a core material such as an inorganic filler and/or a glass fiber (or a glass cloth or a glass fabric), may be used.

In detail, the heat-dissipating member 170 is sealed by the encapsulant 130, thereby improving characteristics of cohesive fracture of the heat-dissipating member 170. The heat-dissipating member 170 includes pyrolytic graphite, in which atomic layers are combined by the Van der Waals interaction, so characteristics of cohesive fracture in a direction (a z direction) perpendicular to an upper surface of the semiconductor chip 120 may be relatively weak. However, the encapsulant 130 is formed to cover an upper surface and side surfaces of the heat-dissipating member 170, thereby improving characteristics of cohesive fracture.

The first connection structure 140 may redistribute the connection pads 122 of the semiconductor chip 120. Several tens to several hundreds of connection pads 122 of the semiconductor chip 120 having various functions may be redistributed by the first connection structure 140, and may be physically or electrically externally connected through the electrical connection metal 165 depending on functions. The first connection structure 140 may include a first insulating layer 141a disposed on the frame 110 and the active surface of the semiconductor chip 120, a first redistribution layer 142a disposed on the first insulating layer 141a, a first via 143a connecting the first redistribution layer 142a to the connection pad 122 of the semiconductor chip 120, a second insulating layer 141b disposed on the first insulating layer 141a, a second redistribution layer 142b disposed on the second insulating layer 141b, a second via 143b connecting the first and second redistribution layers 142a, 142b, and 142c, while passing through the second insulating layer 141b, a third insulating layer 141c disposed on the second insulating layer 141b, a third redistribution layer 142c disposed on the third insulating layer 141c, and a third via 143c connecting the second and third redistribution layers 142b and 142c while passing through the third insulating layer 141c. The first connection structure 140 may include the number of insulating layers, redistribution layers, and vias, greater than illustrated in the drawings.

A material of the insulating layers 141a, 141b, and 141c may be an insulating material. In this case, the insulating material may be a photosensitive insulating material (PID). In this case, a fine pitch may be introduced through a photovia, so it is advantageous in microcircuits and high density design, and tens to millions of connection pads 122 of the semiconductor chip 120 may be effectively redistributed. A boundary between the insulating layers 141a, 141b, and 141c may be clear, or the boundary therebetween may not be readily apparent.

The redistribution layers 142a, 142b, and 142c may allow the connection pad 122 of the semiconductor chip 120 to be redistributed so as to be electrically connected to the electrical connection metal 165. A material for formation of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers may include ground (GND) pattern layers 142G, and may include power (PWR) patterns, signal (S) patterns, and the like. Here, the signal (S) patterns may include various signals except for the ground (GND) signals, the power (PWR) signals, and the like, such as data signals, and the like. Moreover, the redistribution layers 142a, 142b, and 142c may include via pad patterns, electrical connection metal pad patterns, and the like.

The vias 143a, 143b, and 143c electrically connect the redistribution layers 142a, 142b, and 142c, formed in different layers, to each other, and electrically connect the connection pad 122 of the semiconductor chip 120 to the first redistribution layer 142a. The vias 143a, 143b, and 143c may be in physical contact with the connection pad 122 when the semiconductor chip 120 is a bare die. A material for formation of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with a conductive material, or the conductive material may be formed along a wall of a via. In addition, the vias 143a, 143b, and 143c may have all shapes known in the related art, such as a tapered shape, a cylindrical shape, and the like.

On the encapsulant 130, a second connection structure 180, including a backside redistribution layer 182 and a backside via 183, may be disposed. The backside redistribution layer 182 is disposed on the encapsulant 130, and may be connected to the wiring layer 112 of the frame 110 by the backside via 183 passing through the encapsulant 130. The second connection structure 180 may be electrically connected to the connection pad 122 of the semiconductor chip 120 and/or the first connection structure 140. Moreover, the second connection structure 180 may electrically connect a semiconductor chip or a semiconductor package, mounted on an upper portion of a package, to the first connection structure 140 in a lower portion of the package. At least a portion of the backside redistribution layer 182 may be exposed upwardly through the second passivation layer 190 for connection with a configuration in an upper portion. According to an embodiment, the backside redistribution layer 182 has a plate shape in an upper portion of the semiconductor chip 120, and the backside via 183 may have a trench via or line via shape having a predetermined length. In this case, substantially all of movement paths of the electromagnetic waves are blocked, and thus the effect of shielding electromagnetic waves may be further excellent. The backside redistribution layer 182 and the backside via 183 may also include a conductive material such as copper (Cu), aluminum (Al), silver (Ag), tin (Sn), gold (Au), nickel (Ni), lead (Pb), titanium (Ti), or alloys thereof.

The first passivation layer 150 may protect the first connection structure 140 from external physical or chemical damage. The first passivation layer 150 may have an opening exposing at least a portion of the third redistribution layer 142c of the first connection structure 140. The number of openings, formed in the first passivation layer 150, may be several tens to several thousands. A material of the first passivation layer 150 is not particularly limited. For example, an insulating material may be used as the material of the first passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used. A second passivation layer 190 is also formed on the second connection structure 180 to protect the second connection structure 180. The first passivation layer 150 and the second passivation layer 190 include the same material, thereby serving to control a coefficient of thermal expansion (CTE) due to an effect of symmetry.

The underbump metal layer 160 may improve connection reliability of the electrical connection metal 165 to improve board level reliability of the semiconductor package 100A. The underbump metal layer 160 may be connected to the third redistribution layer 142c of the first connection structure 140, exposed through the openings of the first passivation layer 150. The underbump metal layer 160 may be formed in the openings of the first passivation layer 150 by any known metallization method using any known conductive material such as a metal, but is not limited thereto.

The electrical connection metal 165 physically and/or electrically connects the semiconductor package 100A to an external power source. For example, the semiconductor package 100A may be mounted on the mainboard of the electronic device through the electrical connection metal 165. The electrical connection metal 165 may be formed of a conductive material, for example, a solder or the like. However, this is only an example, and a material of each of the electrical connection metal 170 is not particularly limited thereto. Each of the electrical connection metals 165 may be a land, a ball, a pin, or the like. The electrical connection metals 165 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of electrical connection metal 165 are not particularly limited, but may be sufficiently modified depending on design particulars by those skilled in the art. For example, the electrical connection metals 165 may be provided in an amount of several tens to several thousands, or may be provided in an amount of several tens to several thousands or more or several tens to several thousands or less.

At least one of the electrical connection metals 165 may be disposed in a fan-out region of the semiconductor chip 120. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

The passive component 125 may be disposed on a lower surface of the first passivation layer 150, and may be disposed between the electrical connection metals 165. The passive component 125 may be electrically connected to a third redistribution layer 142c. The passive component 125 may include surface-mount technology (SMT) components including, for example, inductors, capacitors, and the like. However, according to embodiments, arrangement of the passive component 125 may be omitted.

Figure 11:
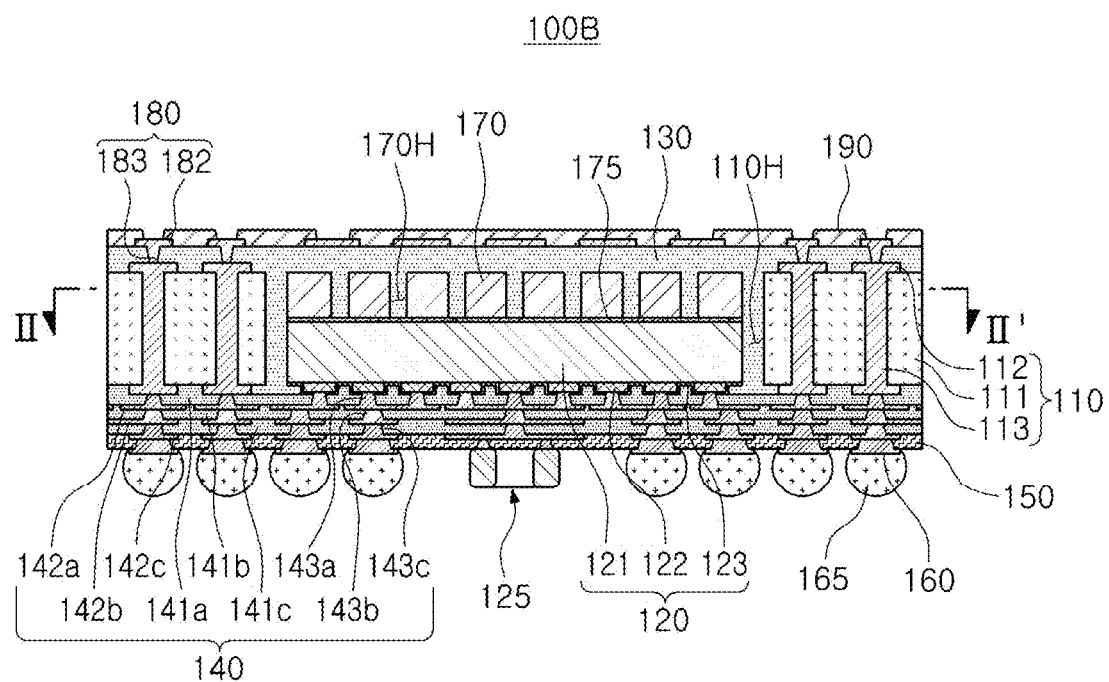
FIG. 11 is a schematic cross-sectional view illustrating another example of a semiconductor package.

FIG. 11 is a schematic cross-sectional view illustrating another example of a semiconductor package.

Figure 12:
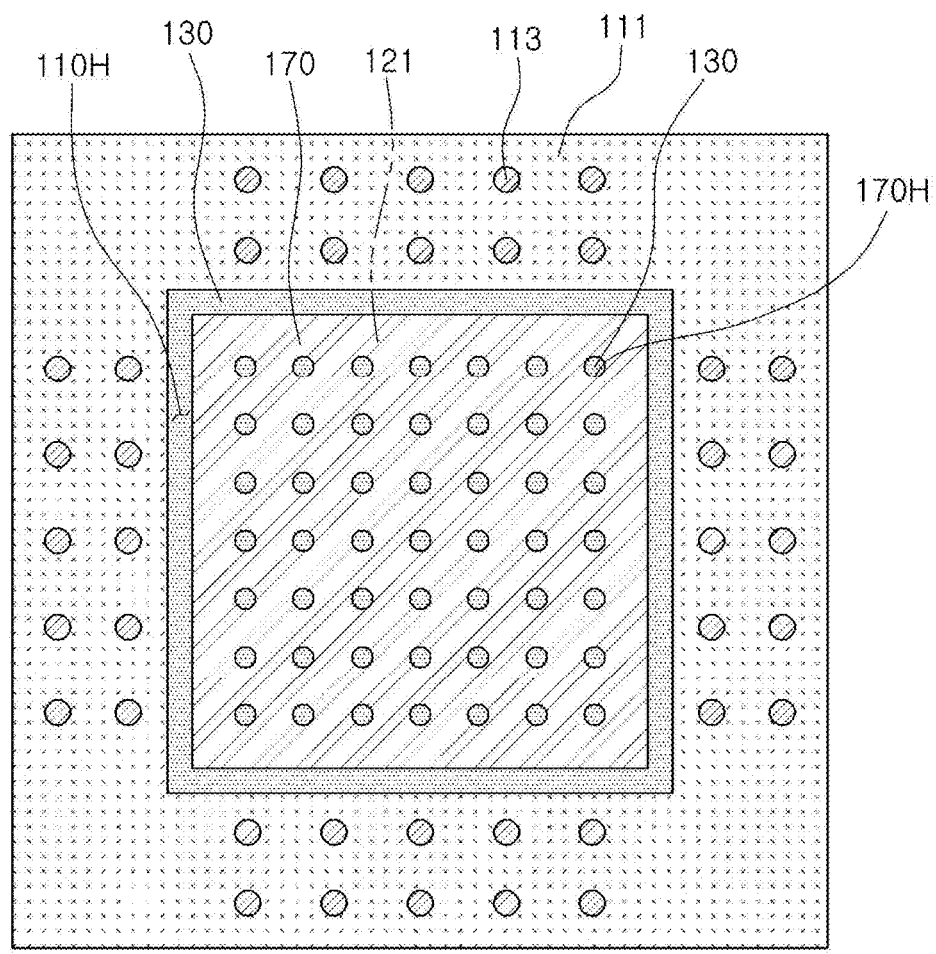
FIG. 12 is a schematic plan view taken along line II-II' of the semiconductor package of FIG. 11.

FIG. 12 is a schematic plan view taken along line II-II' of the semiconductor package of FIG. 11.

Referring to FIGS. 11 and 12, in a semiconductor package 100B according another embodiment, a heat-dissipating member 170 has a plurality of holes 170H. The plurality of holes 170H of the heat-dissipating member 170 are arranged in rows and columns on a plane, as illustrated in FIG. 12, and may pass through the entirety of the heat-dissipating member 170. However, according to embodiments, the hole 170H may pass through a portion of the heat-dissipating member 170 by a predetermined depth from an upper surface of the heat-dissipating member 170. On a plane, the hole 170H may be arranged to have a portion of a total area of the heat-dissipating member 170. For example, a total area of the holes 170H may be about 5% or less. The hole 170H may be filled with the encapsulant 130. In this case, characteristics of cohesive fracture of the heat-dissipating member 170 may be further improved. Other configurations are substantially the same as those described in the above-described semiconductor package 100A and the like, and a detailed description thereof will be omitted.

Figure 13:
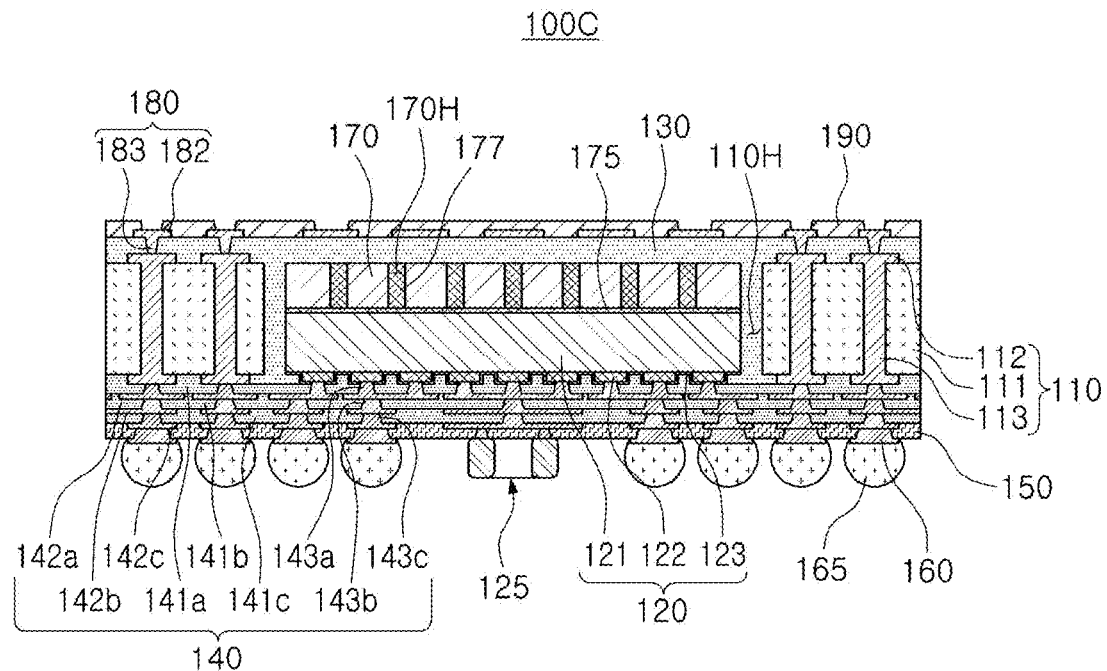
FIG. 13 is a schematic cross-sectional view illustrating another example of a semiconductor package.

FIG. 13 is a schematic cross-sectional view illustrating another example of a semiconductor package.

Referring to FIG. 13, in a semiconductor package 100C according another embodiment, in a manner similar to an embodiment of FIGS. 11 and 12, a heat-dissipating member 170 has a plurality of holes 170H, and the semiconductor package 100C further includes a filling metal layer 177 filling the hole 170H. The filling metal layer 177 may perform a heat dissipation function with the heat-dissipating member 170, and may forma heat dissipation structure. An upper surface of the filling metal layer 177 may be covered by the encapsulant 130. The filling metal layer 177 may include a conductive material such as copper (Cu), aluminum (Al), silver (Ag), tin (Sn), gold (Au), nickel (Ni), lead (Pb), titanium (Ti), or alloys thereof. The hole 170H may be filled with the filling metal layer 177 by pulse-reverse electroplating. Due to the filling metal layer 177, the thermal conductivity of the heat-dissipating member 170 in a direction (z direction) perpendicular to an upper surface of the semiconductor chip 120 may be improved. Other configurations are substantially the same as those described in the above-described semiconductor package 100A and 100B, and the like, and a detailed description thereof will be omitted.

Figure 14:
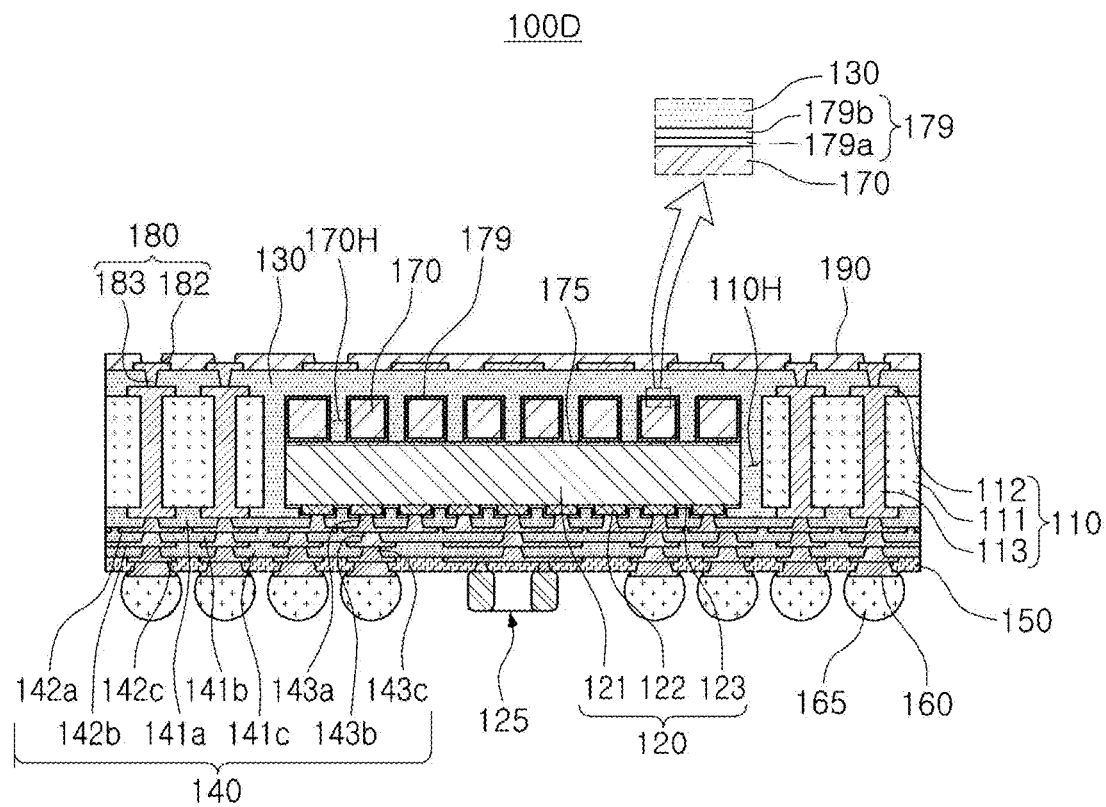
FIG. 14 is a schematic cross-sectional view illustrating another example of a semiconductor package.

FIG. 14 is a schematic cross-sectional view illustrating another example of a semiconductor package.

Referring to FIG. 14, in a semiconductor package 100D according another embodiment, in a manner similar to an embodiment of FIGS. 11 and 12, a heat-dissipating member 170 has a plurality of holes 170H filled by an encapsulant 130, and the semiconductor package 100D further includes a capping metal layer 179 surrounding the heat-dissipating member 170. The capping metal layer 179 may be interposed between the heat-dissipating member 170 and the encapsulant 130. The capping metal layer 179 may surround all sides of the heat-dissipating member 170 and may be disposed in an inner side wall of the hole 170H, but is not limited thereto. For example, according to embodiments, the capping metal layer 179 may be disposed to only cover an upper surface and a side surface of the heat-dissipating member 170, except for a lower surface of the heat-dissipating member 170, in contact with the adhesive layer 175. The capping metal layer 179 may perform a heat dissipation function with the heat-dissipating member 170, and may form a heat dissipation structure. The upper surface and the side surface of the capping metal layer 179 may be covered by the encapsulant 130 with the heat-dissipating member 170.

The capping metal layer 179 may include one or more metal layers. For example, the capping metal layer 179 may include a first layer 179a in contact with the heat-dissipating member 170, and a second layer 179b disposed on the first layer 179a and in contact with the encapsulant 130 or the adhesive layer 175, as illustrated in an enlarged view. The first layer 179a may be a layer having relatively excellent adhesion with the heat-dissipating member 170, as compared with the second layer 179b. The first layer 179a may have a thickness as compared with the second layer 179b, but is not limited thereto. The capping metal layer 179 may include a conductive material such as copper (Cu), aluminum (Al), silver (Ag), tin (Sn), gold (Au), nickel (Ni), lead (Pb), titanium (Ti), or alloys thereof. For example, the first layer 179a may include titanium (Ti), while the second layer 179b may include copper (Cu). The capping metal layer 179 may be formed, before or after the heat-dissipating member 170 is disposed on the semiconductor chip 120, using a deposition process such as sputtering. Due to the capping metal layer 179, the heat-dissipating member 170 may be easily handled during a manufacturing process, and occurrence of contamination such as particle generation caused by graphite in the heat-dissipating member 170 may be prevented. Moreover, due to the capping metal layer 179, the characteristics of cohesive fracture and the thermal conductivity of the heat-dissipating member 170 in a direction (z direction) perpendicular to an upper surface of the semiconductor chip 120 may be further improved. Other configurations are substantially the same as those described in the above-described semiconductor package 100A and 100B, and the like, and a detailed description thereof will be omitted.

Figure 15:
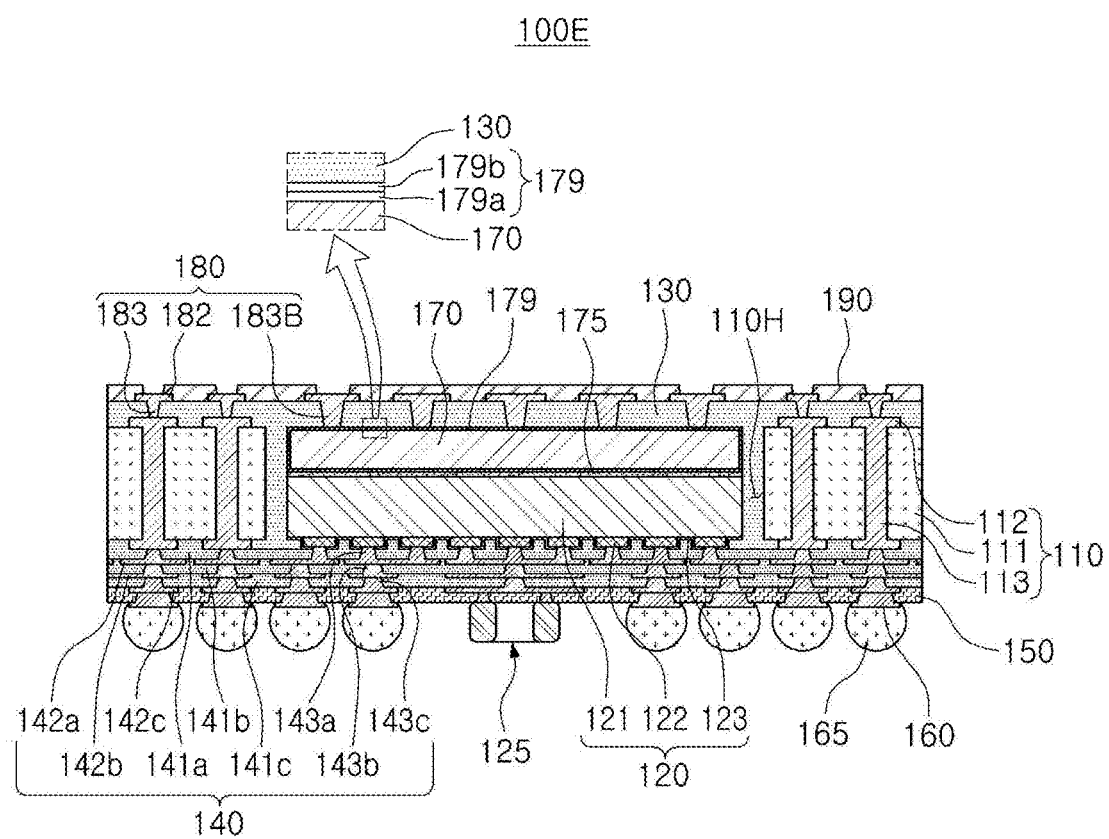
FIG. 15 is a schematic cross-sectional view illustrating another example of a semiconductor package.

FIG. 15 is a schematic cross-sectional view illustrating another example of a semiconductor package.

Referring to FIG. 15, a semiconductor package 100E according another embodiment further includes a capping metal layer 179 surrounding a heat-dissipating member 170, and a second connection structure 180 may further include a heat-dissipating via 183B, connected to the capping metal layer 179. The capping metal layer 179 may surround the entirety of the heat-dissipating member 170 in one. Other descriptions of the capping metal layer 179 are substantially the same as those described in the semiconductor package 100D described above.

The heat-dissipating via 183B may pass through the encapsulant 130 in an upper portion of the heat-dissipating member 170 to connect the backside redistribution layer 182 to the capping metal layer 179. Due to the heat-dissipating via 183B, heat of the semiconductor chip 120 may be more effectively emitted upwardly. An electrical signal may be applied to or may not be applied to the heat-dissipating via 183B. When the electrical signal is not applied to the heat-dissipating via 183B, the backside redistribution layer 182, connected to the heat-dissipating via 183B, may function as a heat dissipation pattern layer. When the electrical signal is applied to the heat-dissipating via 183B, a ground signal may be applied by way of example, and the heat-dissipating member 170 may be electrically connected to the backside redistribution layer 182 by the heat-dissipating via 183B. A material for formation of the heat-dissipating via 183B may be the same as that of the backside via 183, and may be different from that of the heat-dissipating member 170. A material for formation of the heat-dissipating via 183B may be a conductive material such as copper (Cu), aluminum (Al), silver (Ag), tin (Sn), gold (Au), nickel (Ni), lead (Pb), titanium (Ti), or alloys thereof. Other configurations and manufacturing processes are substantially the same as those described in the semiconductor package 100A and 100D according to the above-described embodiment, and a description thereof will be omitted.

Figure 16:
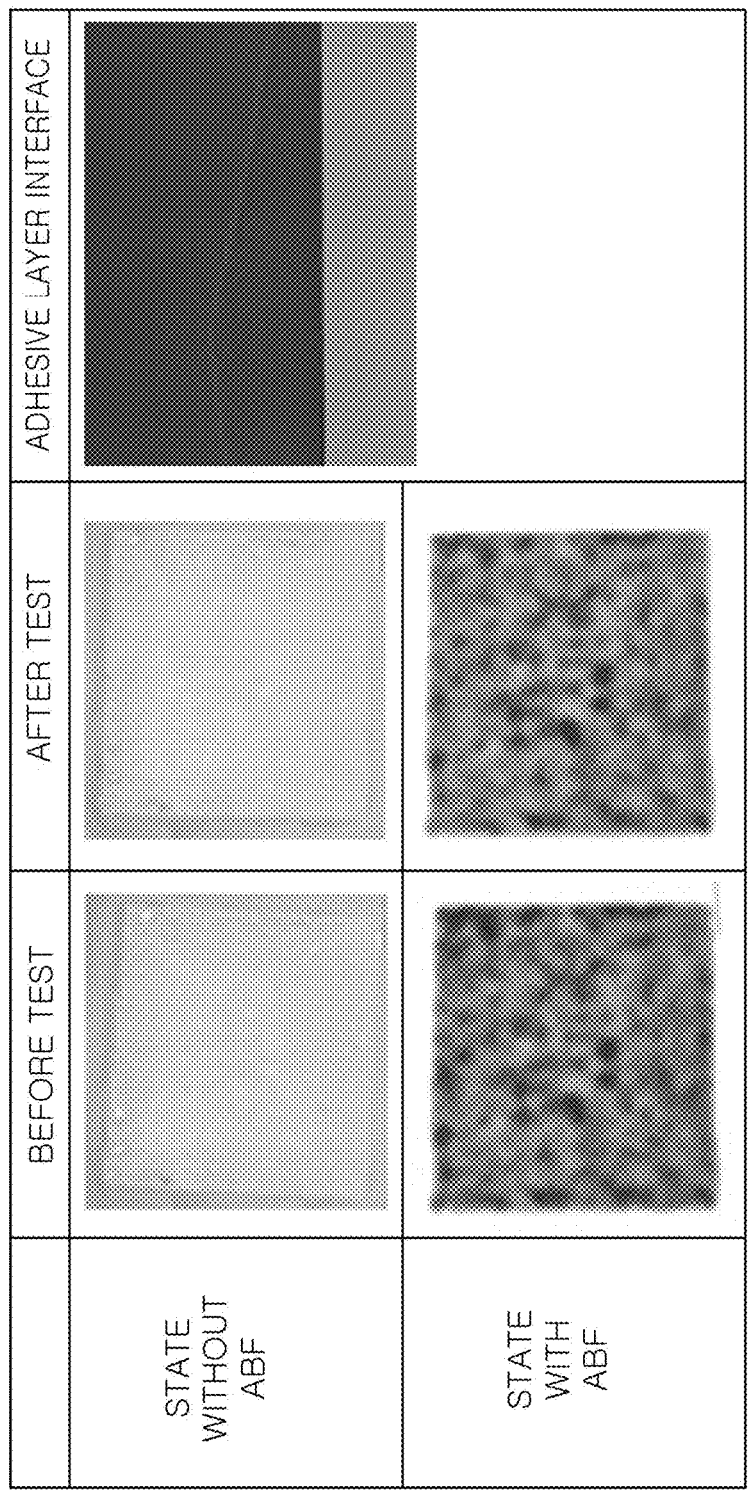
FIG. 16 is a table illustrating reliability evaluation results of a semiconductor package according to an embodiment.

FIG. 16 shows images of a semiconductor package according to an embodiment of the present invention before and after conducting a reliability evaluation test.

Referring to FIG. 16, the reliability evaluation test was conducted using a sample having a structure similar to that of the semiconductor package 100A of FIG. 9. A sample for reliability evaluation was prepared by disposing a pyrolytic graphite layer having a thickness of 25 μm as a heat-dissipating member 170 on a silicon chip having a thickness of 125 μm using an adhesive layer, and an ABF layer having a thickness of 22 μm was formed as an encapsulant 130. The chip for evaluation was tested by Scanning Acoustic Tomography (SAT), before and after three reflow tests, including a test executed for 2 hours at 125° C., a test executed for 12 hours at 85° C. and 85% humidity, and a test executed at 260° C. FIG. 16 includes images of the samples with and without ABF before and after the test. According to the test results for three samples, it was confirmed that there was no change in the surfaces of all three samples before and after the reliability evaluation, and it was confirmed that there was no void. When bonding between layers was well performed, bubbles were not generated therein, so a void was not generated. Moreover, it was confirmed that an adhesive layer 175 having a thickness of 1.5 μm to 2 μm is provided at an interface between the silicon chip and the graphite layer. Thus, in the semiconductor package according to the present embodiment, it was confirmed that bonding and interface reliability is secured.

Figure 17:
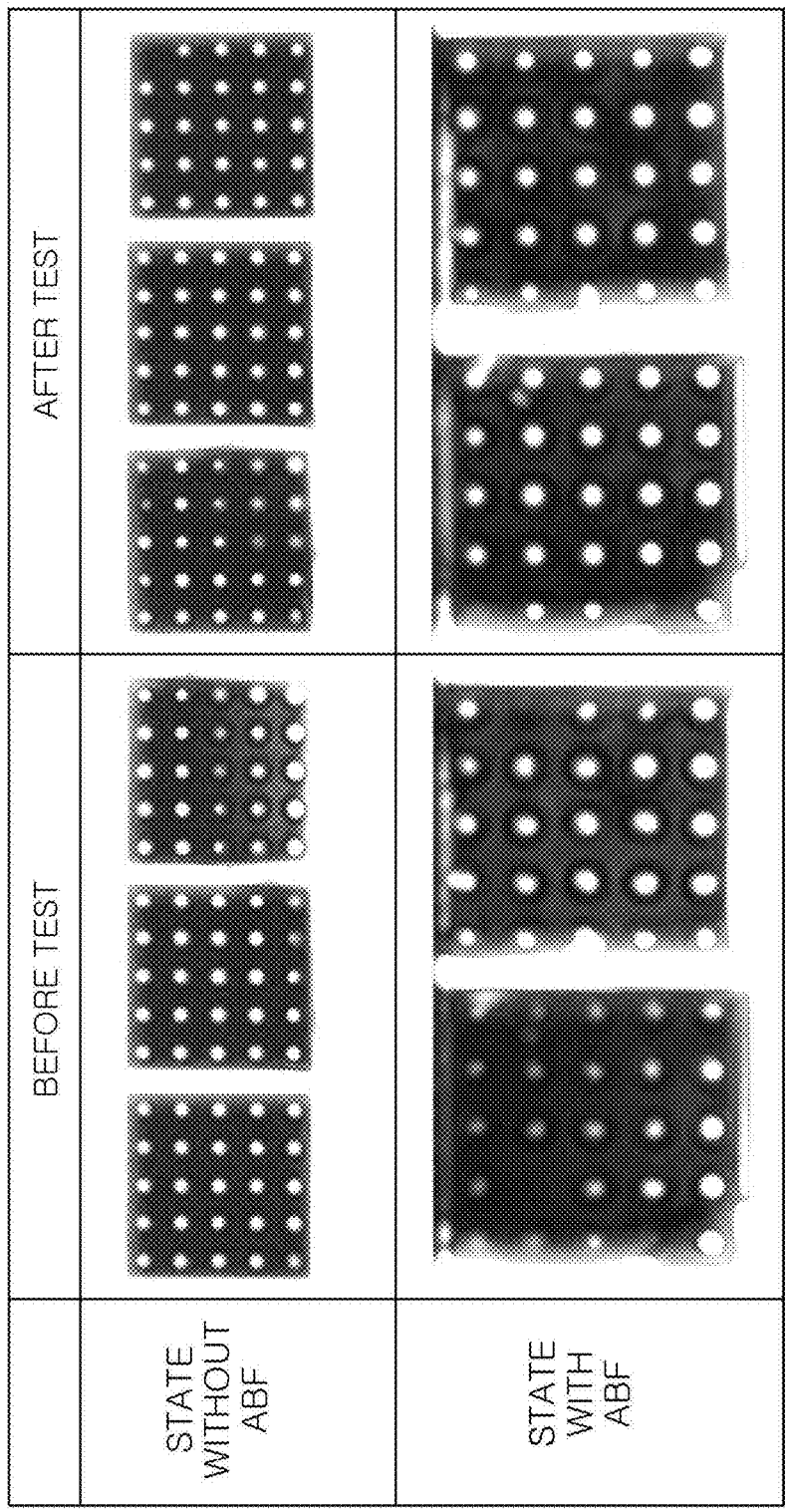
FIG. 17 is a table illustrating reliability evaluation results of a semiconductor package according to an embodiment.

FIG. 17 shows images of a semiconductor package according to the embodiment depicted FIG. 11 of the present invention before and after conducting a reliability evaluation.

FIG. 17 shows the results of performing reliability evaluation for a sample having a structure similar to that of the semiconductor package 100B of FIG. 11. A sample for reliability evaluation was prepared to have a hole in the graphite layer, as compared with that described above with reference to FIG. 16. Test conditions are the same as those described above. According to the test results, it was confirmed that there was no change in the surfaces of all samples before and after the reliability test, and it was confirmed that there was no void. Thus, in the semiconductor package according to the embodiment depicted FIG. 11 of the present invention, it was confirmed that bonding and interface reliability is secured.

Figure 18:
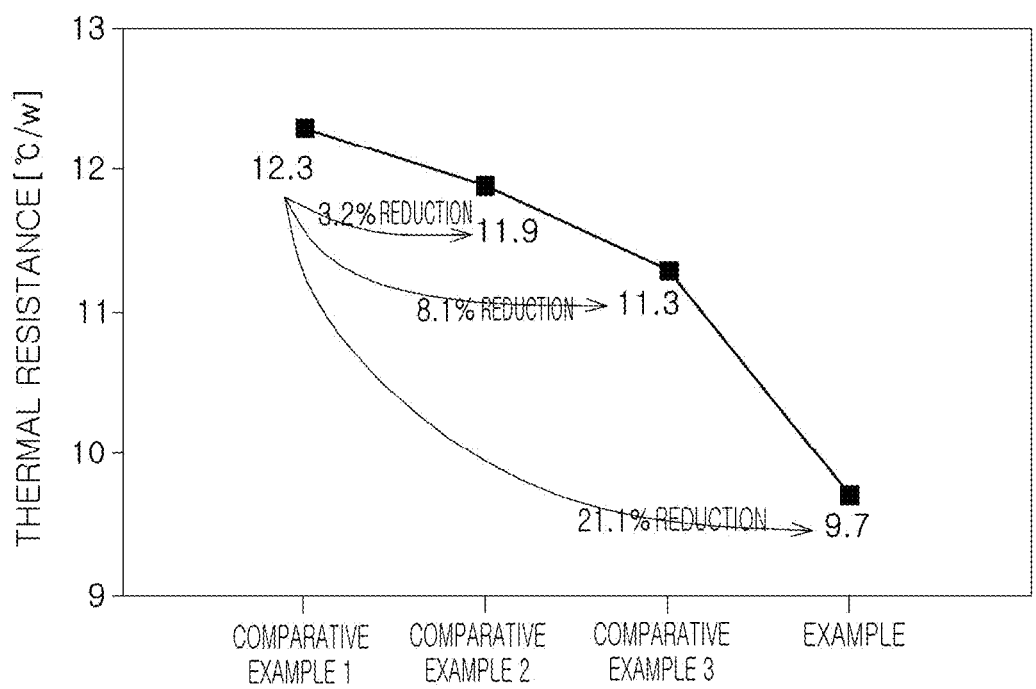
FIG. 18 is a schematic graph illustrating simulation results for a heat dissipation effect of a semiconductor package according to an embodiment.

FIG. 18 is a schematic graph illustrating simulation results for the heat dissipation ability of various semiconductor package structures including an embodiment of a semiconductor package having a structure depicted in FIG. 9.

Referring to FIG. 18, results of simulating thermal resistance in Comparative Examples 1 to 3 and Example, each having a different package structure, are illustrated. Comparative Example 1 is a semiconductor package in which the lower package includes a semiconductor chip having a thickness of 100 μm in a laser drill process (LDP)-POP structure. Comparative Example 2 is a semiconductor package 100A of FIG. 9, which omits a heat-dissipating member 170, and includes a semiconductor chip 120 having a thickness of 100 μm. Comparative Example 3 is a semiconductor package 100A of FIG. 9, which includes a graphite layer having a thickness of 3 μm by sputtering instead of a heat-dissipating member 170, and a semiconductor chip 120 having a thickness of 147 μm. Example is a semiconductor package 100A of FIG. 9, which includes a pyrolytic graphite layer having a thickness of 50 μm as a heat-dissipating member 170, a semiconductor chip 120 having a thickness of 100 μm, and an adhesive layer 175 having a thickness of 1 μm.

According to the simulation results, thermal resistance of Comparative Example 2 was reduced by 3.2% compared with Comparative Example 1, thermal resistance of Comparative Example 3 was reduced by 11.9% compared with Comparative Example 1, and thermal resistance of Example was reduced by 21.1% compared with Comparative Example 1. In detail, comparing Comparative Example 3 with Example, the total thickness, including the semiconductor chip 120 and the graphite layer, is 150 μm. However, in the case of Comparative Example 3, because the graphite layer is formed by sputtering, its thickness is limited by process and cost. As a result, its thermal resistance was relatively high. In the case of Example, because a pyrolytic graphite sheet is used, a thicker heat-dissipating member 170 is able to be formed as compared with Comparative Example 3. As a result, the heat dissipation effect was excellent.

As set forth above, according to the embodiment in the present disclosure, a semiconductor package with excellent heat dissipation characteristics and having a heat-dissipating member with thermal expansion characteristics similar to those of a semiconductor chip may be provided.

While exemplary embodiments have been shown and described above, it will be apparent to those skilled in the art that modifications and variations could be made without departing from the scope of the present invention as defined by the appended claims.

What is claimed is:

1. A semiconductor package, comprising:
   a semiconductor chip having an active surface, on which a connection pad is disposed, and an inactive surface opposite to the active surface;
   a heat-dissipating member disposed on the inactive surface of the semiconductor chip and comprising graphite;
   an encapsulant sealing at least a portion of each of the semiconductor chip and the heat-dissipating member;
   a capping metal layer disposed directly between the heat-dissipating member and the encapsulant; and
   a connection structure disposed on the active surface of the semiconductor chip and comprising a redistribution layer electrically connected to the connection pad,
   wherein the heat-dissipating member includes holes passing through at least a portion of the heat-dissipating member, and the holes overlap the inactive surface of the semiconductor chip.

2. The semiconductor package of claim 1, wherein at least a side surface of the heat-dissipating member is coplanar with a side surface of the semiconductor chip.

3. The semiconductor package of claim 1, wherein the capping metal layer extends to inner side walls of the holes.

4. The semiconductor package of claim 1, wherein the capping metal layer surrounds all surfaces of the heat-dissipating member.

5. The semiconductor package of claim 1, wherein the capping metal layer covers an upper surface and side surfaces of the heat-dissipating member and exposes a lower surface of the heat-dissipating member facing the semiconductor chip.

6. The semiconductor package of claim 1, wherein the encapsulant fills the holes.

7. The semiconductor package of claim 1, further comprising a filling metal layer filling each of the holes.

8. The semiconductor package of claim 1, wherein the capping metal layer comprises a first layer in contact with the heat-dissipating member, and further comprises a second layer on the first layer and in contact with the encapsulant.

9. The semiconductor package of claim 1, further comprising a frame having a through-hole,
   wherein the semiconductor chip and the heat-dissipating member are disposed in the through-hole of the frame.

10. The semiconductor package of claim 1, wherein a thickness of the heat-dissipating member is less than a thickness of the semiconductor chip.

11. The semiconductor package of claim 1, wherein the heat-dissipating member has a same size as a size of the semiconductor chip on a plane.

12. The semiconductor package of claim 1, further comprising:
   a backside redistribution layer disposed on the encapsulant; and
   a heat-dissipating via passing through the encapsulant, and connecting the backside redistribution layer to the capping metal layer.

13. A semiconductor package, comprising:
   a semiconductor chip having an active surface, on which a connection pad is disposed, and an inactive surface opposite to the active surface;
   a heat-dissipating member disposed on the inactive surface of the semiconductor chip and comprising graphite;
   an encapsulant sealing at least a portion of each of the semiconductor chip and the heat-dissipating member;
   a capping metal layer disposed directly between the heat-dissipating member and the encapsulant; and
   a connection structure disposed on the active surface of the semiconductor chip and comprising a redistribution layer electrically connected to the connection pad;
   a backside redistribution layer on the encapsulant; and
   a via passing through the encapsulant, and connecting the backside redistribution layer to the capping metal layer.

14. The semiconductor package of claim 13, wherein the heat-dissipating member is electrically connected to the backside redistribution layer by the via.

15. The semiconductor package of claim 13, wherein the via comprises a material different from a material of the heat-dissipating member.

16. The semiconductor package of claim 13, wherein the heat-dissipating member includes holes passing through at least a portion of the heat-dissipating member, the holes overlapping the inactive surface of the semiconductor chip.

17. A semiconductor package, comprising:
   a semiconductor chip having a first surface, on which a connection pad is disposed, and a second surface opposite to the first surface;
   a heat-dissipating member disposed on the second surface of the semiconductor chip and comprising graphite;
   an encapsulant sealing at least a portion of each of the semiconductor chip and the heat-dissipating member;
   a capping metal layer disposed directly between the heat-dissipating member and the encapsulant; and
   a connection structure disposed on the first surface of the semiconductor chip and comprising a redistribution layer electrically connected to the connection pad.

18. The semiconductor package of claim 17, wherein the heat-dissipating member includes holes passing through at least a portion of the heat-dissipating member, and each of the holes is filled with a filling metal layer.

19. The semiconductor package of claim 18, wherein the holes overlap the second surface of the semiconductor chip.

20. The semiconductor package of claim 18, wherein an upper surface of the filling metal layer is covered with the encapsulant.

* * * * *